United States Patent
Yamada et al.

(10) Patent No.: US 8,941,700 B2
(45) Date of Patent: Jan. 27, 2015

(54) CONDENSED POLYCYCLIC COMPOUND AND ORGANIC LIGHT EMITTING ELEMENT CONTAINING THE SAME

(71) Applicant: Canon Kabushiki Kaisha, Tokyo (JP)

(72) Inventors: Naoki Yamada, Inagi (JP); Jun Kamatani, Tokyo (JP); Kengo Kishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/262,578

(22) Filed: Apr. 25, 2014

(65) Prior Publication Data

US 2014/0320578 A1   Oct. 30, 2014

(30) Foreign Application Priority Data

Apr. 30, 2013  (JP) ................................. 2013-096002

(51) Int. Cl.
  *B41J 2/385* (2006.01)
  *H01L 51/00* (2006.01)
  *H01L 27/32* (2006.01)
  *B41J 2/45* (2006.01)

(52) U.S. Cl.
  CPC ........ *H01L 51/0055* (2013.01); *H01L 51/0056* (2013.01); *H01L 51/0058* (2013.01); *H01L 51/0067* (2013.01); *H01L 27/3244* (2013.01); *B41J 2/45* (2013.01)
  USPC ........................................................ 347/130

(58) Field of Classification Search
  USPC ......................................... 347/129, 130, 238
  See application file for complete search history.

(56) References Cited

U.S. PATENT DOCUMENTS 6,803,126 B2 *  10/2004  Sotoyama et al. ............... 257/88
2013/0048965 A1 *   2/2013  Kosuge et al. ................... 257/40
2013/0048966 A1 *   2/2013  Horiuchi et al. ................. 257/40

FOREIGN PATENT DOCUMENTS

JP       10-189248 A     7/1998

* cited by examiner

*Primary Examiner* — Kristal Feggins
(74) *Attorney, Agent, or Firm* — Canon USA, Inc. IP Division

(57) ABSTRACT

To provide a condensed polycyclic compound shown in the following General Formula [1], in which

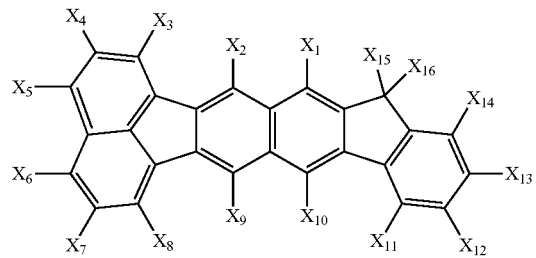

$X_1$ to $X_{16}$ each are independently selected from a hydrogen atom, an aryl group, a heterocyclic group, an alkyl group, an alkoxy group, and an amino group and the aryl group, the heterocyclic group, the alkyl group, the alkoxy group, and the amino group may have a substituent.

12 Claims, 1 Drawing Sheet

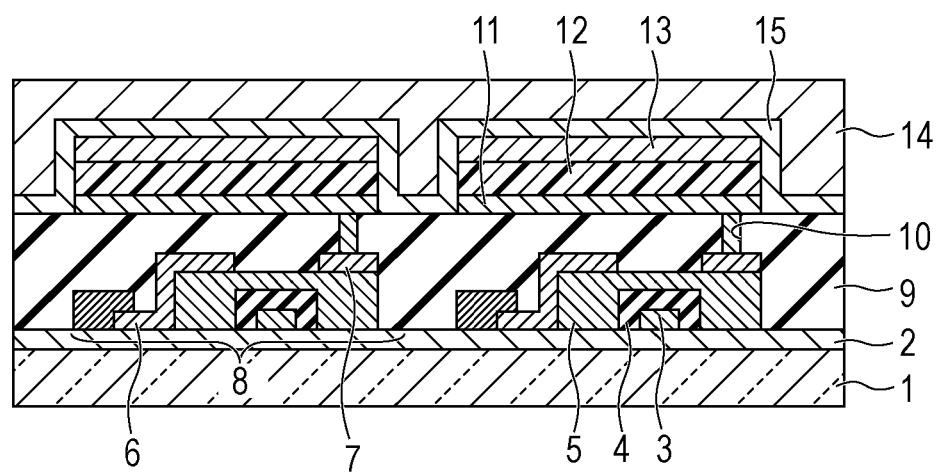

CONDENSED POLYCYCLIC COMPOUND AND ORGANIC LIGHT EMITTING ELEMENT CONTAINING THE SAME

BACKGROUND OF THE INVENTION

1. Field of the Invention

The present invention relates to a novel polycyclic compound and an organic light emitting element containing the same.

2. Description of the Related Art

The organic light emitting element is an element having a pair of electrodes and an organic compound layer disposed between the electrodes. By injecting electrons and holes from these pairs of electrodes, excitons of a luminescent organic compound in the organic compound layer are generated, and then light is emitted when the excitons return to the ground state.

Japanese Patent Laid-Open No. 10-189248 discloses a compound 144 (a-1 shown below) and a compound 145 (a-2 shown below) shown below as the light emitting material. The structural formulae thereof are shown below.

[Chem. 1]

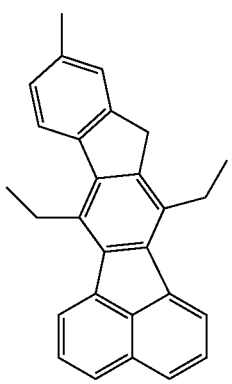

a-2

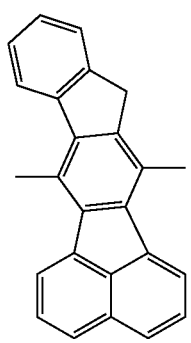

a-1

SUMMARY OF THE INVENTION

The invention provides a condensed polycyclic compound shown in the following General Formula [1].

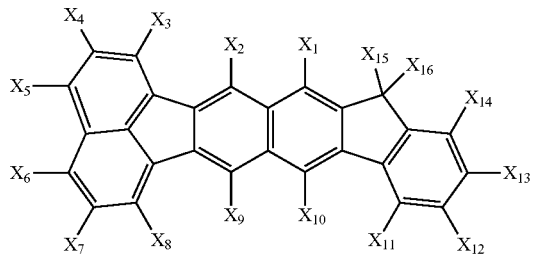

[1]

$X_1$ to $X_{16}$ each are independently selected from a hydrogen atom, an aryl group, a heterocyclic group, an alkyl group, an alkoxy group, and an amino group. The aryl group, the heterocyclic group, the alkyl group, the alkoxy group, and the amino group may have a substituent.

Further features of the present invention will become apparent from the following description of exemplary embodiments with reference to the attached drawing.

BRIEF DESCRIPTION OF THE DRAWING

FIGURE is a cross-sectional schematic view illustrating an organic light emitting element and a switching element to be connected to the organic light emitting element.

DESCRIPTION OF THE EMBODIMENTS

The compound of Japanese Patent Laid-Open No. 10-189248 has room for improvement in two respects that the fluorescence quantum yield is low and the ionization potential is low as a compound for use in the organic light emitting element.

The inventions provide a novel condensed ring compound. The invention also provides an organic light emitting element which has high luminous efficiency and is driven at a low voltage.

A novel organic compound according to the invention is a condensed polycyclic compound shown in the following General Formula [1].

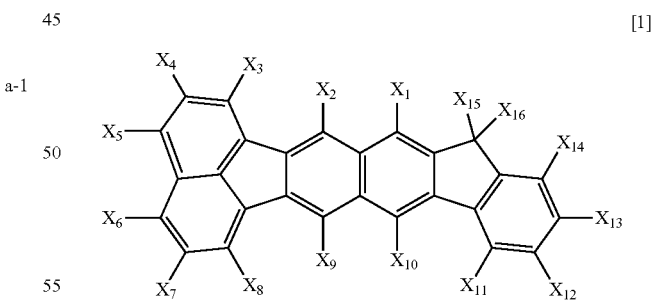

[1]

$X_1$ to $X_{16}$ each are independently selected from a hydrogen atom, an aryl group, a heterocyclic group, an alkyl group, an alkoxy group, and an amino group. The aryl group, the heterocyclic group, the alkyl group, the alkoxy group, and the amino group may have a substituent.

Specific examples of the aryl group include a phenyl group, a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthyl group, an aceanthryl group, a triphenylenyl group, a chrysenyl group, a naphthacenyl group, a perylenyl group, a pentacenyl group, a biphenyl group, a terphenyl group, and a fluorenyl group.

Specific examples of the heterocyclic group include a thienyl group, a benzothiophenyl group, a dibenzothiophenyl group, a pyrrolyl group, a pyridyl group, an oxazolyl group, an oxadiazolyl group, a thiazolyl group, a thiadiazolyl group, a terthienyl group, a carbazolyl group, an acridinyl group, a phenanthroyl group, and the like.

Specific examples of the alkyl group include a methyl group, an ethyl group, a normal propyl group, an isopropyl group, a normal butyl group, a tertiary butyl group, a cyclohexyl group, an octyl group, an adamantyl group, and the like. Preferably, alkyl groups having 1 to 4 carbon atoms are mentioned. Due to having an alkyl group, the heat resistance of the compound becomes high.

Specific examples of the alkoxy group include a methoxy group, an ethoxy group, an isopropoxy group, a normal opropoxy group, a secondary butoxy group, a tertiary butoxy group, a hexoxy group, an octoxy group, and the like. Preferably, alkoxy groups having 1 to 4 carbon atoms are mentioned. Due to having an alkoxy group, the heat resistance of the compound becomes high.

Specific examples of the amino group include a dimethylamino group, a diethylamino group, a dibenzylamino group, a diphenylamino group, a ditolylamino group, a dianisolylamino group, and the like.

The substituents mentioned above (aryl groups, heterocyclic groups, alkyl groups, alkoxy groups, and amino groups) may have substituents. Examples of the substituents include alkyl groups having 1 to 4 carbon atoms, such as a methyl group, an ethyl group, a propyl group, and a tertiary butyl group, aralkyl groups, such as a benzyl group and a phenethyl group, aryl groups, such as a phenyl group and a biphenyl group, heterocyclic groups, such as a thienyl group, a pyrrolyl group, and a pyridyl group, amino groups, such as a dimethylamino group, a diethylamino group, a dibenzylamino group, a diphenylamino group, a ditolylamino group, and a dianisolylamino group, alkoxyl groups, such as a methoxyl group, an ethoxyl group, a propoxyl group, and a phenoxyl group, and the like.

The base skeleton of the novel condensed polycyclic compound according to the invention is shown as the following formula A-1. The base skeleton A-1 has a high fluorescence quantum yield and low ionization potential (close to vacuum level) as compared with the base skeleton (skeleton structure shown in the following A-2) of the compounds a-1 and a-2 described in Field of the Invention above.

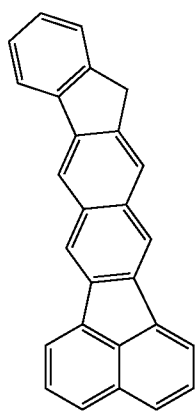

A-1

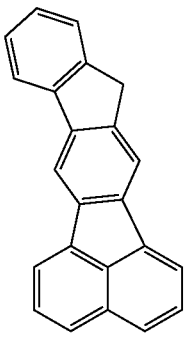

A-2

Table shown below shows the comparison of the oscillator strength and the HOMO level based on the molecular orbital method calculation results of A-1 and A-2.

TABLE

| Compound No. | Oscillator strength | HOMO level |
|---|---|---|
| A-1 | 0.27 | −5.26 |
| A-2 | 0.073 | −5.42 |

The molecular orbital method calculation was performed by a currently widely used Gaussian 09 (Gaussian 09, Revision A. 02, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas J. B. Foresman, J. V. Ortiz, J. Cioslowski, and D. J. Fox, Gaussian, Inc., Wallingford Conn. and 2009). As the calculation technique, a currently widely used density functional theory (DFT) was used. B3LYP was used for the functional and 6-31G* was used for the basis function.

The above calculation results show that A-1 of the invention has high oscillator strength, and therefore the high fluorescence yield is high. This is considered to be because, in the skeleton of A-1, the molecule axis is long in a direction where the transition dipole becomes high as compared with A-2. Moreover, the calculation results show that the HOMO level is low as compared with A-1.

As described above, when the novel condensed polycyclic compound according to the invention is used as an organic light emitting element, particularly as a light emitting material, a light emitting element with high efficiency can be provided. When used as a light emitting layer, in other words when used as a host-guest type light emitting layer and used as a host material, it is easy to inject holes from an adjacent layer, so that a light emitting element which is driven at a low voltage can be provided. The adjacent layer is an organic compound layer contacting a light emitting layer on the anode side of the light emitting layer and is a layer referred to as a hole transport layer or an electron blocking layer, for example.

Specific examples of the compound in General Formula [1] according to the invention are shown below. However, the invention is not limited thereto.

B-1

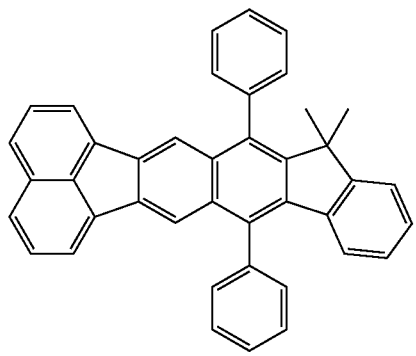

B-2

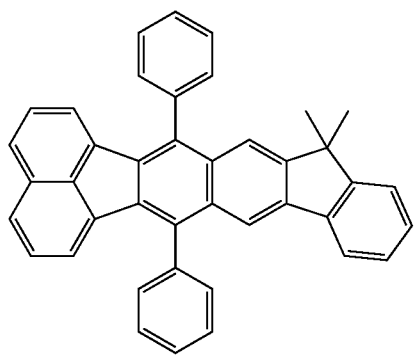

B-3

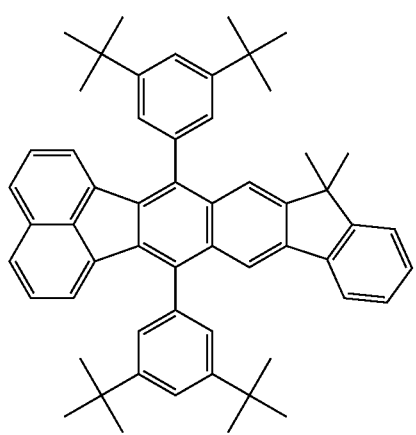

B-4

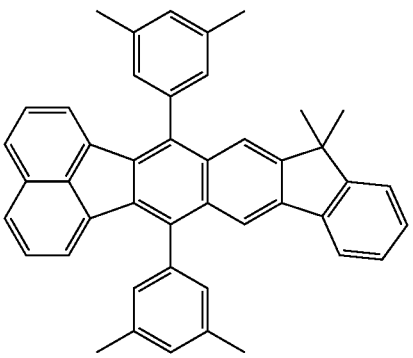

B-5

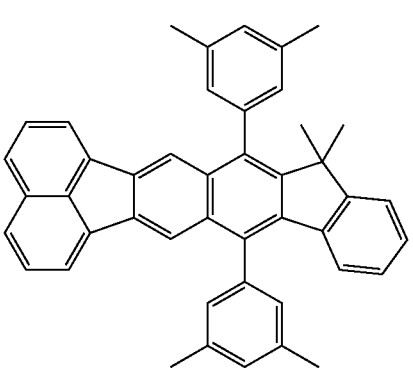

B-6

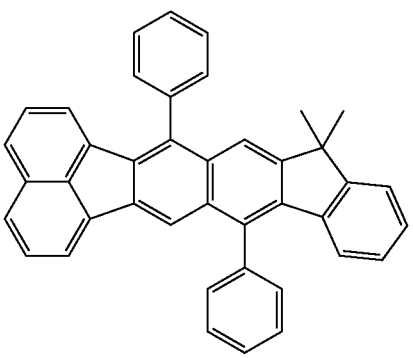

B-7

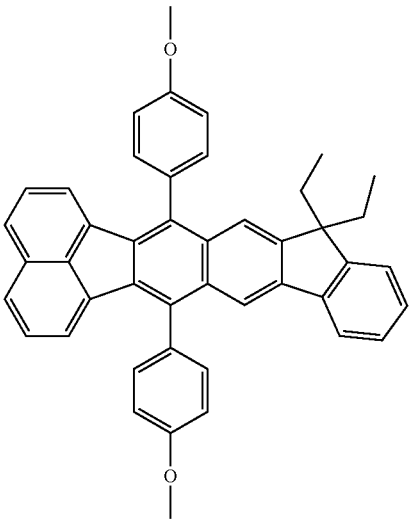

-continued
B-8
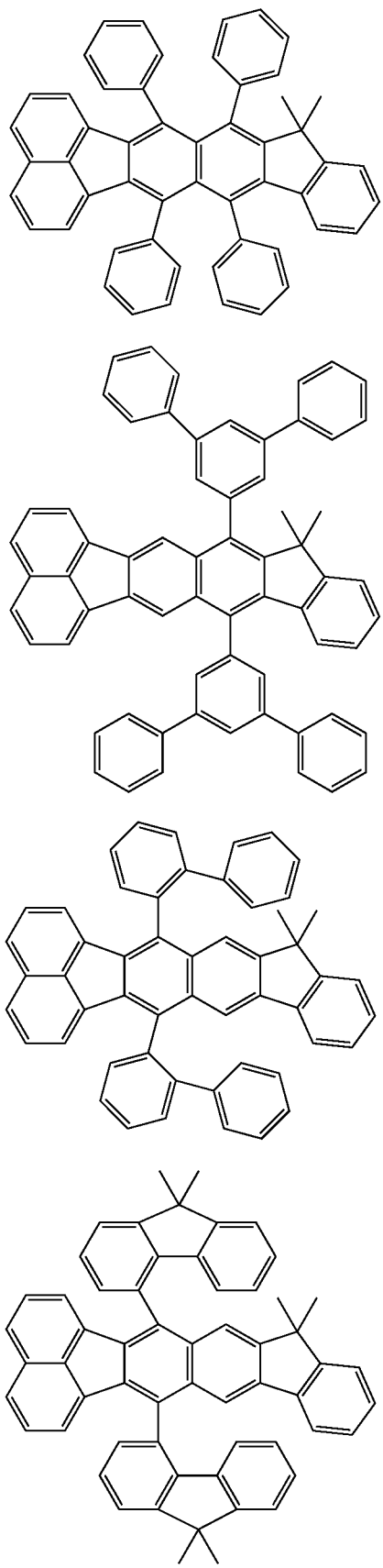
B-9
B-10
B-11
-continued
B-12
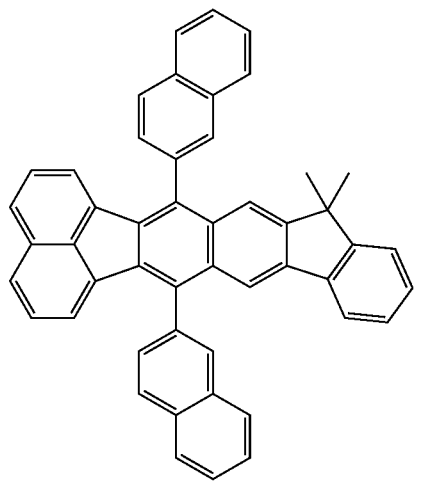
B-13
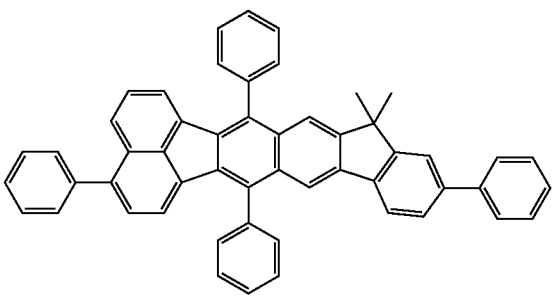
B-14
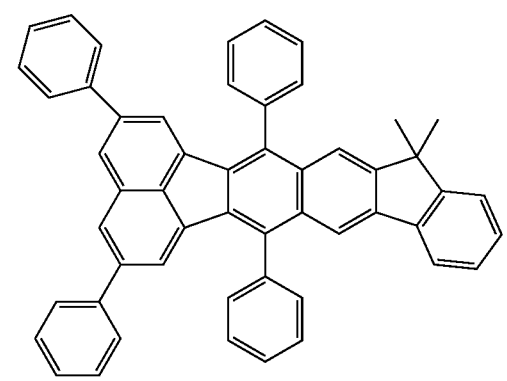
B-15
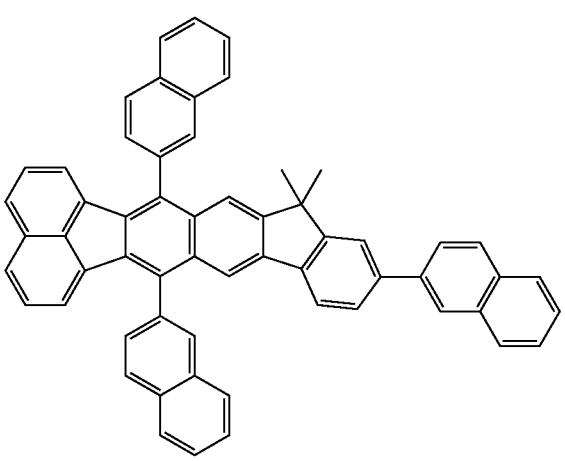

B-16
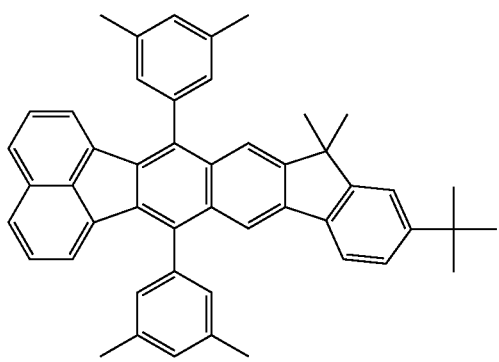
B-17
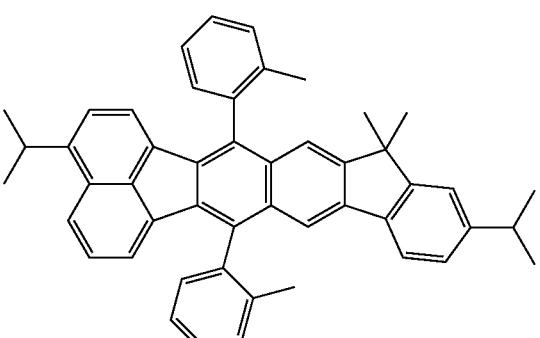
B-18
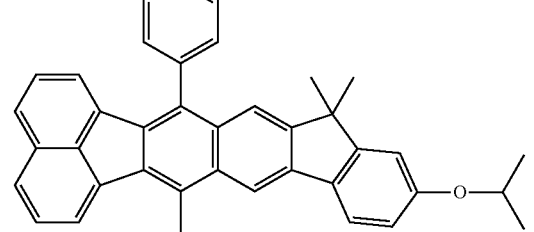
B-19
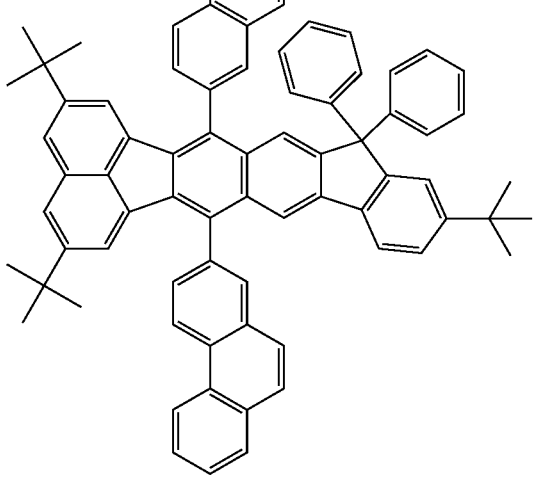
B-20
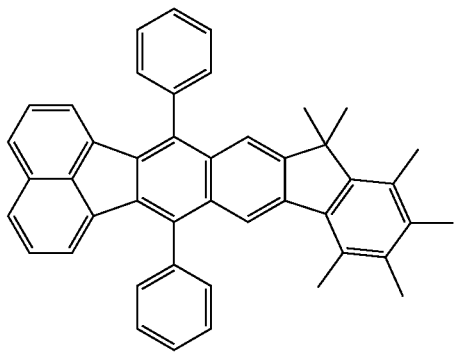
B-21
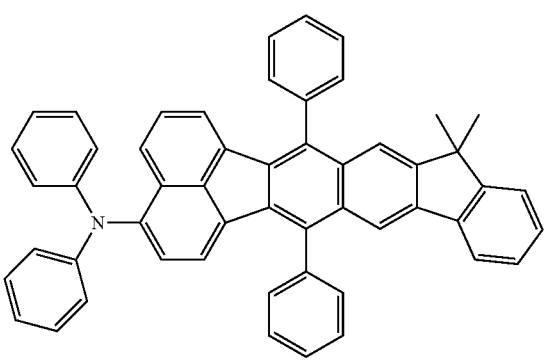
B-22
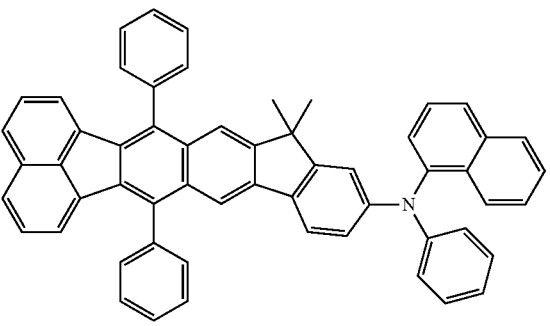
B-23
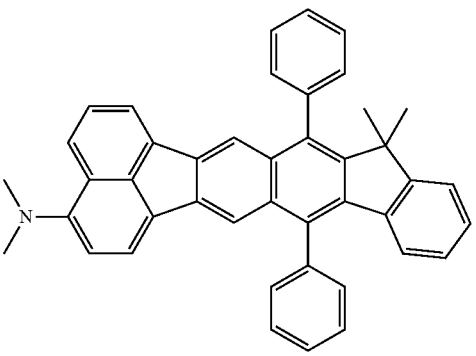

-continued

B-24
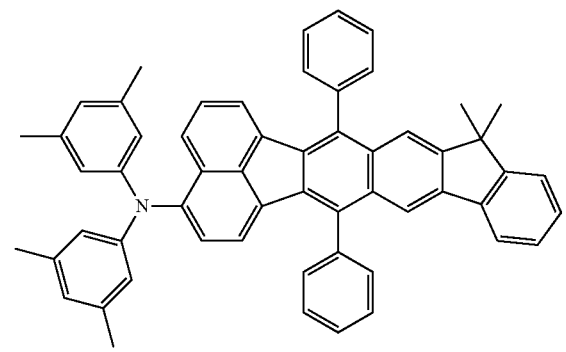

B-25
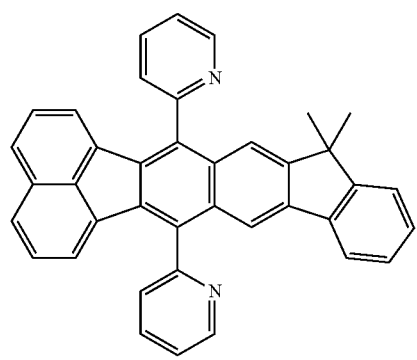

B-26
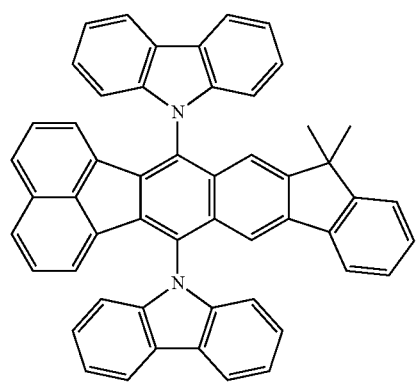

B-27
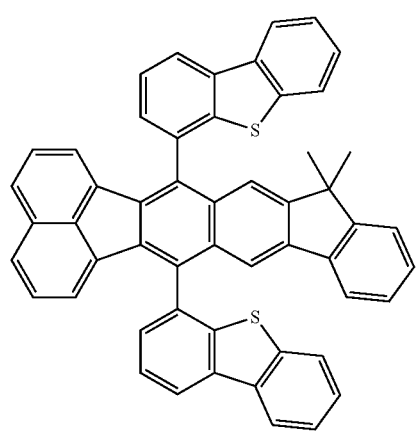

-continued

B-28
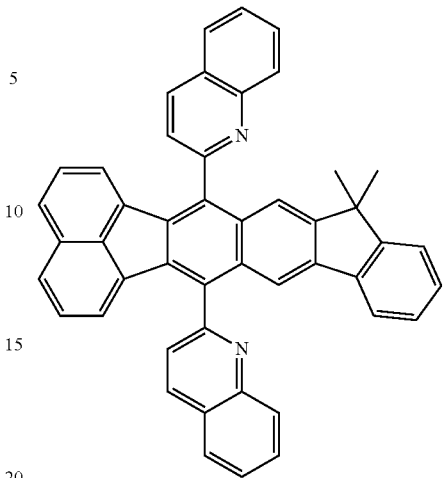

Properties of Exemplary Compounds

1) B-1 to B-24

Groups in which at least two of $X_1$, $X_2$ $X_9$, and $X_{10}$ in General Formula [1] are substituted by aryl groups are mentioned. More specifically, at least one of $X_1$ and $X_2$ is an aryl group among and at least one of $X_9$ and $X_{10}$ is an aryl group.

Since these substitution positions $X_1$, $X_2$, $X_9$, and $X_{10}$ have steric exclusion with the adjacent groups, the plane angle is large relative to the base skeleton. Therefore, overlapping (overlapping of molecules) of the base skeletons is reduced, so that the concentration quenching is avoided. The concentration quenching is an expression which refers to a phenomenon in which when the concentration of the compound becomes high, light is not emitted. The effect that the concentration quenching is avoided is higher when $X_1$, $X_2$, $X_9$, and $X_{10}$ are substituted by aryl groups having a high steric exclusion volume, such as a phenyl group, a terphenyl group, and a naphthyl group, rather than when substituted by a hydrogen atom or alkyl groups as the substituents. Furthermore, the effect is much larger when the aryl group is substituted by an alkyl group.

2) B-13 to B-20

Groups in which substituents are further substituted in addition to $X_1$, $X_2$, $X_9$, and $X_{10}$ in General Formula [1] are mentioned. The overlapping of the base skeletons is further reduced, so that the concentration quenching is avoided. When an alkyl group and an alkoxy group substitute, the HOMO becomes low and the hole injection property is high due to the effect of the electron-donating property.

3) B-21 to B-24

Groups in which an amino group substitutes as a substituent are mentioned. According to the effect of the electron-donating property, the HOMO becomes low and the holes injection property is high.

4) B-25 to B-28

Groups in which at least two of $X_1$, $X_2$, $X_9$, and $X_{10}$ in General Formula [1] are substituted by heterocyclic groups are mentioned. More specifically, at least one of $X_1$ and $X_2$ is a heterocyclic group and at least one of $X_9$ and $X_{10}$ is a heterocyclic group. With respect to these substituents, the overlapping of the base skeletons is reduced, so that the concentration quenching is avoided. Moreover, when a nitrogen containing heterocycle having an electron withdrawing property substitutes, the electron injection property is high.

Description of Organic Light Emitting Element

Next, an organic light emitting element according to this embodiment is described.

The organic light emitting element according to this embodiment is an element having an anode and a cathode which form a pair of electrodes and an organic compound layer disposed between the electrodes, in which the organic compound layer contains the organic compound represented by General Formula [1].

As the organic light emitting element produced using the organic compound according to the invention, one having a configuration in which an anode, a light emitting layer, and a cathode are successively provided on a substrate is mentioned. In addition thereto, one in which an anode, a hole transport layer, an electron transport layer, and a cathode are successively provided is mentioned. Moreover, one in which an anode, a hole transport layer, a light emitting layer, an electron transport layer, and a cathode are successively provided is mentioned. Moreover, one in which an anode, a hole injection layer, a hole transport layer, a light emitting layer, an electron transport layer, and a cathode are successively provided and one in which an anode, a hole transport layer, a light emitting layer, a hole/exciton blocking layer, an electron transport layer, and a cathode are successively provided are mentioned. However, the examples of these five multilayer types are very fundamental element configurations, and the configuration of the organic light emitting element employing the compound according to the invention is not limited thereto.

The organic compound represented by General Formula [1] of the invention can be used as a host material or a guest material of the light emitting layer. Particularly when used as a fluorescent host material or preferably when combined with a guest material which emits light in a green region to a red region having a light emission peak in a region of 490 nm to 660 nm, the exciton energy loss is low, and therefore the efficiency of the light emitting element becomes high.

When the organic compound according to this embodiment is used as a guest material, the concentration of the guest material to the host material is preferably 0.1 mass % or more and 30 mass % or less and more preferably 0.5 wt % or more and 10 wt % or less.

The organic compound represented by General Formula [1] of the invention can be used as an electron transport layer, an electron injection layer, a hole transport layer, and a hole injection layer.

In the organic light emitting element according to this embodiment, known low-molecular-weight and high-molecular-weight materials can be used as required in addition to the organic compound according to the invention. The low-molecular-weight and high-molecular-weight materials are hole injectable materials, hole transportable materials, host materials, guest materials, electron injectable materials, electron transportable materials, or the like and these materials can be used together.

The hole injectable material or the hole transportable material is preferably a material having high hole mobility. Examples of the low-molecular-weight and high-molecular-weight materials having hole injection capability or hole transportation capability include a triarylamine derivative, a phenylene diamine derivative, a stilbene derivative, a phthalocyanine derivative, a porphyrin derivative, poly(vinyl carbazole), poly(thiophene), and other conductive polymers but it is a matter of course that the low-molecular-weight and high-molecular-weight materials are not limited thereto.

Examples of the host material include a triarylamine derivative, a phenylene derivative, condensed ring aromatic compounds (e.g., a naphthalene derivative, a phenanthrene derivative, a fluorene derivative, a chrysene derivative, and the like), organic metal complexes (e.g., an organic aluminum complex, such as tris(8-quinolinolate) aluminum, an organic beryllium complex, an organic iridium complex, an organic platinum complex, and the like), and polymer derivatives, such as a poly(phenylene vinylene) derivative, a poly(fluorene) derivative, a poly(phenylene) derivative, a poly(thienylene vinylene) derivative, and a poly(acetylene) derivative but it is a matter of course that the host material is not limited thereto.

Moreover, a fluorescence dopant can also be used and examples thereof include condensed compounds (e.g., a fluorene derivative, a naphthalene derivative, a pyrene derivative, a perylene derivative, a tetracene derivative, an anthracene derivative, rubrene, and the like), a quinacridone derivative, a coumarin derivative, a stilbene derivative, organic aluminum complexes, such as tris(8-quinolinato) aluminum, an organic beryllium complex, and polymer derivatives, such as a poly(phenylene vinylene) derivative, a poly(fluorene) derivative, and a poly(phenylene) derivative.

As the electron injectable material and the electron transportable material, materials are selected considering, for example, the balance with the hole movement degree of the hole injectable compound or the hole transportable compound. Examples of the materials having electron injection capability or electron transportation capability include an oxadiazole derivative, an oxazole derivative, a pyrazine derivative, a triazole derivative, a triazine derivative, a quinoline derivative, a quinoxaline derivative, a phenanthroline derivative, an organic aluminum complex, and the like but it is a matter of course that the material is not limited thereto.

As a material of the anode, materials having as high a work function as possible are suitably used. Examples thereof include simple metal substances, such as gold, platinum, silver, copper, nickel, palladium, cobalt, selenium, vanadium, and tungsten, or an alloy thereof, and metal oxides, such as tin oxide, zinc oxide, indium oxide, indium tin oxide (ITO), and indium zinc oxide, for example. Moreover, conductive polymers, such as polyaniline, polypyrrole, and polythiophene, may be acceptable. These electrode substances may be used singly or two or more kinds of the substances may be used in combination. The anode may be a single layer structure or a multilayer structure.

On the other hand, as a material of the cathode, materials having a low work function are suitably used. Examples include alkaline metals, such as lithium, alkaline earth metals, such as calcium, simple metal substances, such as aluminum, titanium, manganese, silver, lead, and chromium, for example. Or, an alloy obtained by combining these simple metal substances can also be used. For example, magnesium-silver, aluminum-lithium, aluminum-magnesium, and the like can be used. Metal oxides, such as indium tin oxide (ITO), can also be utilized. These electrode substances may be used singly or two or more kinds of the substances may be used in combination. The cathode may be a single layer structure or a multilayer structure.

In the organic light emitting element according to this embodiment, a layer containing the organic compound according to this embodiment and a layer containing the other organic compound are formed by the following methods. In general, a layer is formed by a vacuum deposition method, an ionization vapor deposition method, sputtering, plasma, or a known coating method (e.g., spin coating, dipping, a casting method, an LB method, and an inkjet method) after dissolving the organic compound in a suitable solvent. When a layer is formed by a vacuum deposition method, a solution coating method, or the like herein, crystallization is difficult to occur and the stability with time is excellent. In the case of the formation by a coating method, a film can also be formed in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, urea resin, and the like but the binder resin is not limited thereto. The binder resins may be used singly as a homopolymer or a copolymer or as a mixture of two or more kinds thereof. Furthermore, known additives, such as a plasticizer, an antioxidant agent, and a UV absorber, may be used in combination as required. Intended use of organic light emitting element The organic light emitting element according to the invention can be used for a display device or a lighting device. In addition thereto, the organic light emitting element according to the invention is used for an exposure light source of an electrophotographic image formation device, a back light of a liquid crystal display, and the like.

The lighting device has a converter which converts an alternating current to a direct current (e.g., AC/DC converter circuit for supplying a drive voltage). The organic light emitting element in a lighting portion obtains electricity from the power supply of a home or an office, for example, similarly as a fluorescent light, and then emits light.

An electrophotographic image formation device refers to a copying machine or a laser beam printer, for example. The electrophotographic image formation device has a photo conductor for obtaining a latent image. The photo conductor is exposed by the light source, whereby a latent image is obtained. For the light source, the organic light emitting element according to the invention can be used. The light source has two or more of the organic light emitting elements and the organic light emitting elements may be arranged in one row in the longitudinal direction of the photo conductor, for example. Each organic light emitting element may be configured so that light emission and non-light emission can be independently controlled.

The electrophotographic image formation device may further have a charging portion which charges the surface of the photo conductor.

The display device has the organic light emitting element according to this embodiment at a display portion. The display portion has a plurality of pixels. The pixel has the organic light emitting element according to this embodiment and an active element for controlling the light emission luminance. The active element is, for example, a switching element, and further, for example, a TFT element. The anode or the cathode of the organic light emitting element and the drain electrode or the source electrode of the TFT element are connected. The display device can be used as an image display device of PC and the like.

The display device may be an image input device which has an image input portion which inputs information from an area CCD, a linear CCD, a memory card, or the like and outputs the input image to the display portion. As the display portion of an image pickup device or an inkjet printer, both an image output function for displaying an image based on the image information input from the outside and an input function for inputting processing information to an image as an operation panel may be provided. The display device may also be used for the display portion of a multifunction printer and the like.

Next, a display device employing the organic light emitting element according to this embodiment is described with reference to FIGURE.

FIGURE is a cross-sectional schematic view illustrating an example of the organic light emitting element according to this embodiment and a TFT element which is an example of a switching element to be connected to the organic light emitting element. In FIGURE, two pairs of the organic light emitting element and the TFT element are illustrated. The details of the structure are described below.

A display device of FIGURE is provided with a glass substrate 1 and a moisture resistant film 2 for protecting the TFT element or the organic compound layer on the glass substrate 1. The reference numeral 3 denotes a metal gate electrode 3. The reference numeral 4 denotes a gate insulation film 4 and the reference numeral 5 denotes a semiconductor layer.

A TFT element 8 has the semiconductor layer 5, a drain electrode 6, and a source electrode 7. An insulation film 9 is provided on the TFT element 8. An anode 11 of the organic light emitting element and the source electrode are connected through a contact hole 10. The configuration of the display device is not limited to the configuration and either one of the anode or the cathode may be connected to either one of the source electrode or the drain electrode of the TFT element.

An organic compound layer 12 is illustrated in such a manner that a multilayer organic compound layer forms one layer. On a cathode 13, a first protection layer and a second protection layer 15 for suppressing degradation of the organic light emitting element are provided.

In the display device according to this embodiment, the switching element is not particularly limited and a single-crystal silicon substrate, an MIM element, and an a-Si type element, and the like may be used.

EXAMPLES

Hereinafter, the invention is described in detail with reference to Examples. However, the invention is not limited thereto.

Example 1

Synthesis of Exemplary Compound B-2

The compound B-2 was synthesized according to the synthetic scheme shown below.

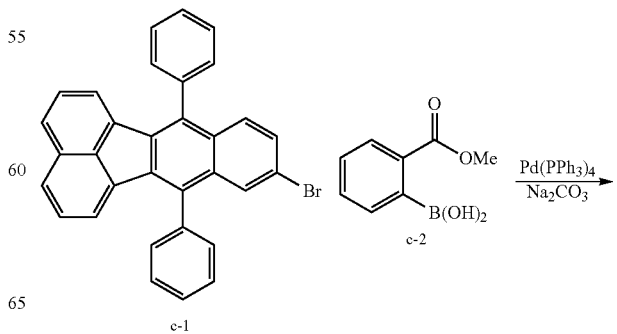

-continued

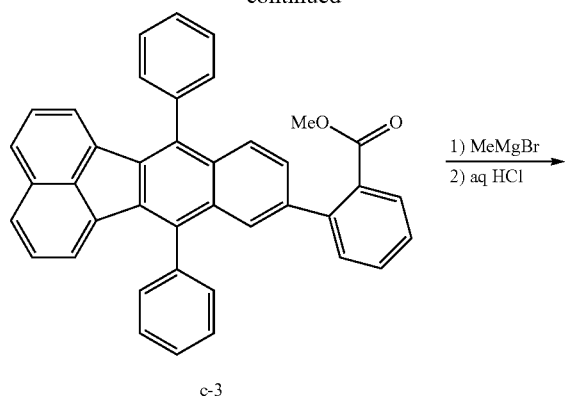

c-3

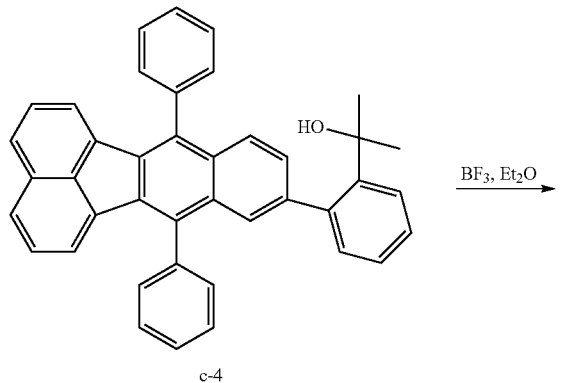

c-4

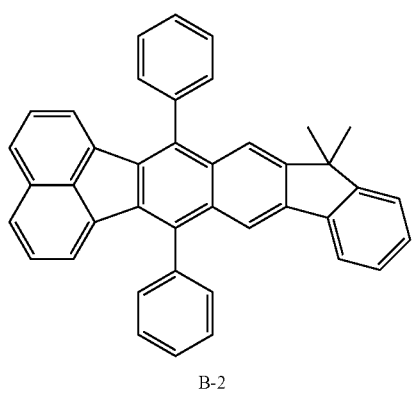

B-2

Synthesis of Exemplary Compound c-3

In a 100-ml three necked flask, 1.5 g (3.11 mmol) of the compound c-1, 0.616 g (3.42 mmol) of the compound c-2, 5 g of sodium carbonate, and 50 ml of dioxane were placed, and then 0.173 g of tetrakis(triphenylphosphine) palladium (0) was added while stirring the mixture at room temperature in a nitrogen atmosphere. The temperature was increased to 80° C., and then the mixture was stirred for 8 hours. After the end of the reaction, the organic layer was extracted with toluene, dried over anhydrous sodium sulfate, and then purified in a silica gel column (mixture of toluene and heptane, developing solvent) to obtain 1.22 g (73% of yield) of the compound c-3 (yellowish white solid).

Synthesis of compound c-4

In a 100-ml three necked flask, 1.0 g (1.86 mmol) of the compound c-3 and 30 ml of anhydrous THF were placed in a nitrogen atmosphere, and then 1.86 ml of a THF solution of 3M methyl magnesium chloride was added dropwise while stirring the mixture under ice cooling in a nitrogen atmosphere. The temperature was increased to room temperature, and then the mixture was stirred for 4 hours. After the end of the reaction, 3 ml of 1N hydrochloric acid was added, and then the mixture was stirred at room temperature for 1 hour. Thereafter, the organic layer was extracted with chloroform, dried over anhydrous sodium sulfate, and then purified in a silica gel column (chloroform developing solvent) to obtain 0.42 g (42% of yield) of the compound c-4 (yellowish white solid).

Synthesis of Exemplary Compound B-2

In a 50-ml three necked flask, 0.36 g (0.67 mmol) of the compound c-4 and 30 m of anhydrous dichloromethane were placed, and then 0.8 ml of a boron trifluoride diethylether complex was added while stirring the mixture under ice cooling in a nitrogen atmosphere. The temperature was increased to room temperature, and then the mixture was stirred for 2 hours. 30 ml of water was added, the organic layer was extracted with chloroform, dried over anhydrous sodium sulfate, and then purified in a silica gel column (mixture of toluene and heptane, developing solvent) to obtain 0.22 g (63% of yield) of the exemplary compound B-2 (yellowish white solid).

The mass spectrometry confirmed 520 which was M+ of the exemplary compound B-2 was checked.

Example 2

Synthesis of Exemplary Compound B-3

The exemplary compound B-3 was synthesized in the same manner as in Example 1, except changing the compound c-1 to the following compound c-10.

The mass spectrometry confirmed 745 which was M+ of the exemplary compound B-3.

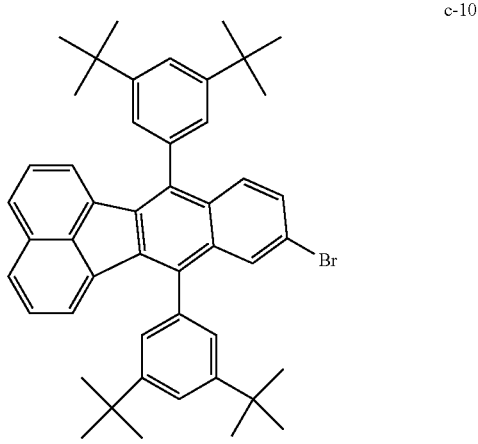 [SMILES: CC(C)(C)c1cc(-c2c3c(c(-c4cc(C(C)(C)C)cc(C(C)(C)C)c4)c4cc(Br)ccc24)-c2cccc4cccc-3c24)cc(C(C)(C)C)c1]

c-10

Example 3

Synthesis of Exemplary Compound B-4

The exemplary compound B-4 was synthesized in the same manner as in Example 1, except changing the compound c-1 to the following compound c-11.

The mass spectrometry confirmed 577 which was M+ of the exemplary compound B-4.

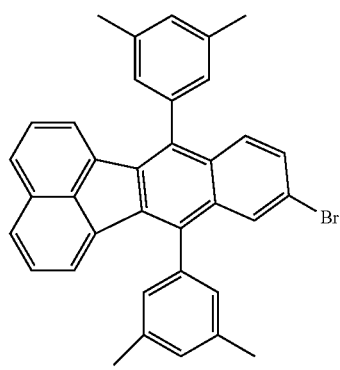

c-11

Example 4

Synthesis of Exemplary Compound B-10

The exemplary compound B-10 was synthesized in the same manner as in Example 1, except changing the compound c-1 to the following compound c-12.

The mass spectrometry confirmed 673 which was M+ of the exemplary compound B-10.

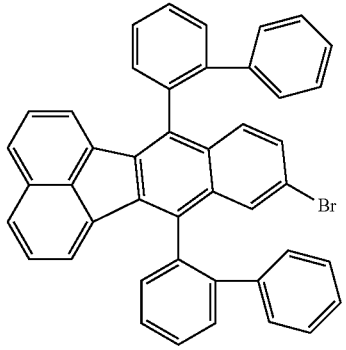

c-12

Example 5

Synthesis of Exemplary Compound B-12

The exemplary compound B-12 was synthesized in the same manner as in Example 1, except changing the compound c-1 to the following compound c-13.

The mass spectrometry confirmed 621 which was M+ of the exemplary compound B-12.

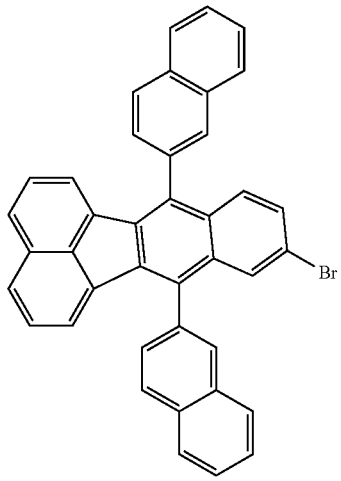

c-13

Example 6

Synthesis of Exemplary Compound B-25

The exemplary compound B-25 was synthesized in the same manner as in Example 1, except changing the compound c-1 to the following compound c-14.

The mass spectrometry confirmed 523 which was M+ of the exemplary compound B-25.

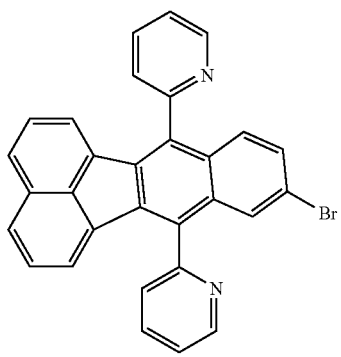

c-14

Example 7

In this example, an organic light emitting element having a configuration in which an anode, a hole transport layer, a light emitting layer, an electron transport layer, and a cathode were successively provided on a substrate was produced by the following method.

One in which an ITO was formed with a film thickness of 120 nm as an anode on a glass substrate by a sputtering method was used as a transparent conductive support substrate (ITO substrate). On the ITO substrate, the organic compound layer and the electrode layers shown below were continuously formed by vacuum deposition by resistance heating in a $10^{-5}$ Pa vacuum chamber. In this case, the area of the facing electrodes was set to 3 mm². Hole transport layer (30 nm) d-1

Light emitting layer (30 nm) Host: B-2, Guest: d-2 (weight ratio of 1%)

Electron transport layer (30 nm) d-3

Metal electrode layer 1 (1 nm) LiF

Metal electrode layer 2 (100 nm) Al

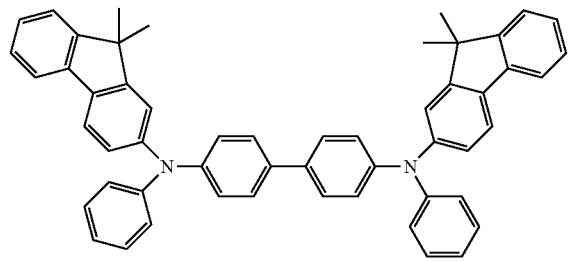

d-1

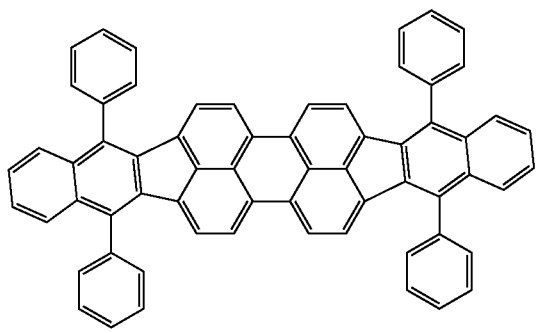

d-2

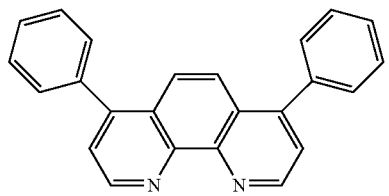

d-3

When 5.0 V applied voltage was applied to the obtained organic light emitting elements using the ITO electrode as the anode and the Al electrode as the cathode, red light emission with the CIE chromaticity coordinates (0.65, 0.34) by the compound d-2 was observed.

As described above with reference to the embodiment and Examples, the invention can provide a novel condensed ring compound with a high fluorescence quantum yield and high ionization potential. The invention can also provide an organic light emitting element containing such a novel condensed polycyclic compound.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-096002, filed Apr. 30, 2013, which is hereby incorporated by reference herein in its entirety.

What is claimed is:

1. A condensed polycyclic compound shown in the following General Formula [1],

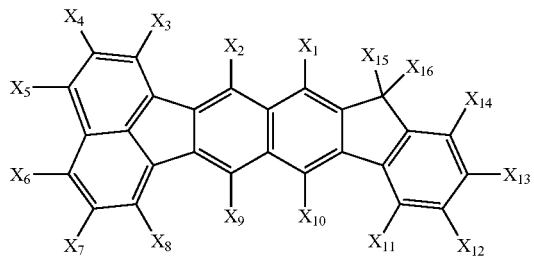

[1]

wherein $X_1$ to $X_{16}$ each are independently selected from a hydrogen atom, an aryl group, a heterocyclic group, an alkyl group, an alkoxy group, and an amino group and the aryl group, the heterocyclic group, the alkyl group, the alkoxy group, and the amino group may have a substituent.

2. The condensed polycyclic compound according to claim 1, wherein at least two of $X_1$, $X_2$, $X_9$, and $X_{10}$ in General Formula [1] are the aryl groups.

3. The condensed polycyclic compound according to claim 2, wherein the $X_2$ and the $X_9$ are the aryl groups.

4. The condensed polycyclic compound according to claim 2, wherein the aryl group is any one of a phenyl group, a naphthyl group, and a pyridyl group.

5. The condensed polycyclic compound according to claim 1, wherein the substituent is any one of an alkyl group having 1 to 4 carbon atoms, a phenyl group, and a biphenyl group.

6. An organic light emitting element, comprising:
a pair of electrodes; and
an organic compound layer disposed between the pair of electrodes, wherein
the organic compound layer has the condensed polycyclic compound according to claim 1.

7. The organic light emitting element according to claim 6, wherein the organic compound layer is a light emitting layer, the light emitting layer contains a host material and a guest material, and the host material is the condensed polycyclic compound.

8. The organic light emitting element according to claim 7, further comprising an organic compound layer which is disposed on an anode side of the light emitting layer and contacts the light emitting layer.

9. An image display device, comprising:
a plurality of pixels, wherein
at least one of the plurality of pixels has the organic light emitting element according to claim 6 and an active element connected to the organic light emitting element.

10. An image information processing device, comprising:
an input portion which inputs image information; and
a display portion which displays an image, wherein
the display portion is the image display device according to claim 9.

11. A lighting device, comprising:
the organic light emitting element according to claim 6; and
an AC/DC converter circuit for supplying a drive voltage to the organic light emitting element.

12. An electrophotographic image formation device, comprising:

a photo conductor; and
a light source which exposes the photo conductor to obtain a latent image on the photo conductor, wherein
the light source has two or more of the organic light emitting elements according to claim 6.

* * * * *